(12) United States Patent
Deshpande

(10) Patent No.: US 8,848,411 B2
(45) Date of Patent: Sep. 30, 2014

(54) SHARED STACK DUAL PHASE CONTENT ADDRESSABLE MEMORY (CAM) CELL

(71) Applicant: Chetan Deshpande, San Jose, CA (US)

(72) Inventor: Chetan Deshpande, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 13/626,300

(22) Filed: Sep. 25, 2012

(65) Prior Publication Data

US 2014/0085957 A1   Mar. 27, 2014

(51) Int. Cl.
  *G11C 15/04*   (2006.01)
(52) U.S. Cl.
  USPC .................. 365/49.1; 365/49.11; 365/49.17
(58) Field of Classification Search
  USPC ........................................................ 365/49.1
  See application file for complete search history.

(56) References Cited

U.S. PATENT DOCUMENTS

| | | | | |
|---|---|---|---|---|
| 6,704,216 B1 * | 3/2004 | Cheng et al. | ............... | 365/49.17 |
| 6,901,000 B1 * | 5/2005 | Ichiriu et al. | ............... | 365/49.17 |
| 7,277,309 B1 * | 10/2007 | Banachowicz et al. | ..... | 365/49.11 |
| 7,907,432 B2 * | 3/2011 | Deshpande et al. | ......... | 365/49.1 |
| 8,462,532 B1 * | 6/2013 | Argyres | ...................... | 365/49.1 |
| 8,625,320 B1 * | 1/2014 | Argyres | ...................... | 365/49.1 |

* cited by examiner

*Primary Examiner* — Son Mai

(74) *Attorney, Agent, or Firm* — Sterne, Kessler, Goldstein & Fox P.L.L.C.

(57) ABSTRACT

A shared stack dual-phase CAM cell is provided. The CAM cell includes at least first and second stacks that share a single pair of pull-down transistors. At least one pair of pull-down transistors can thus be eliminated, reducing the area and power consumption of the CAM cell. Sharing of the single pair of pull-down transistors is enabled by time-staggered pre-charge and compare operations such that the pre-charge interval of the first stack corresponds to the compare interval of the second stack, and vice versa.

20 Claims, 5 Drawing Sheets

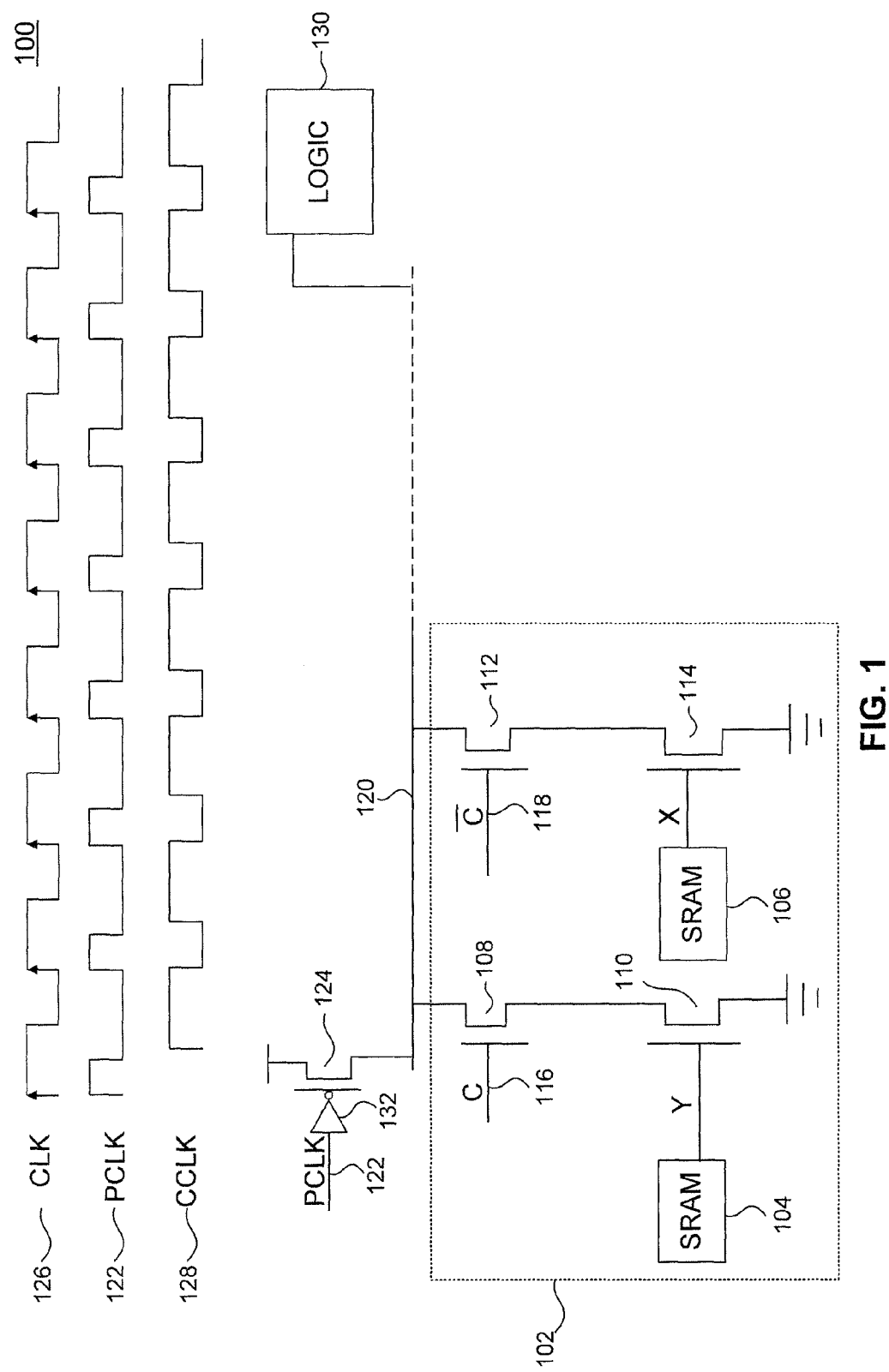
FIG. 1
(Conventional)

200

| Data | Mask | X | Y |
|------|------|---|---|
| 0    | 1    | 0 | 0 |
| 1    | 1    | 0 | 0 |
| 0    | 0    | 0 | 1 |
| 1    | 0    | 1 | 0 |

202 → Data
204 → Mask

FIG. 2

SHARED STACK DUAL PHASE CONTENT ADDRESSABLE MEMORY (CAM) CELL

BACKGROUND

1. Field of the Invention

The field of the invention relates generally to content addressable memory (CAM).

2. Background Art

Content-addressable memories (CAMs) are hardware search engines often used for search-intensive applications. CAMs are composed of semiconductor memory bitcells with added comparison circuitry that enable a search operation to complete in a single clock cycle.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the subject matter of the disclosure.

FIG. 1 illustrates an example single stack content addressable memory (CAM).

FIG. 2 illustrates an example logic state encoding of a CAM cell.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Figure 3:
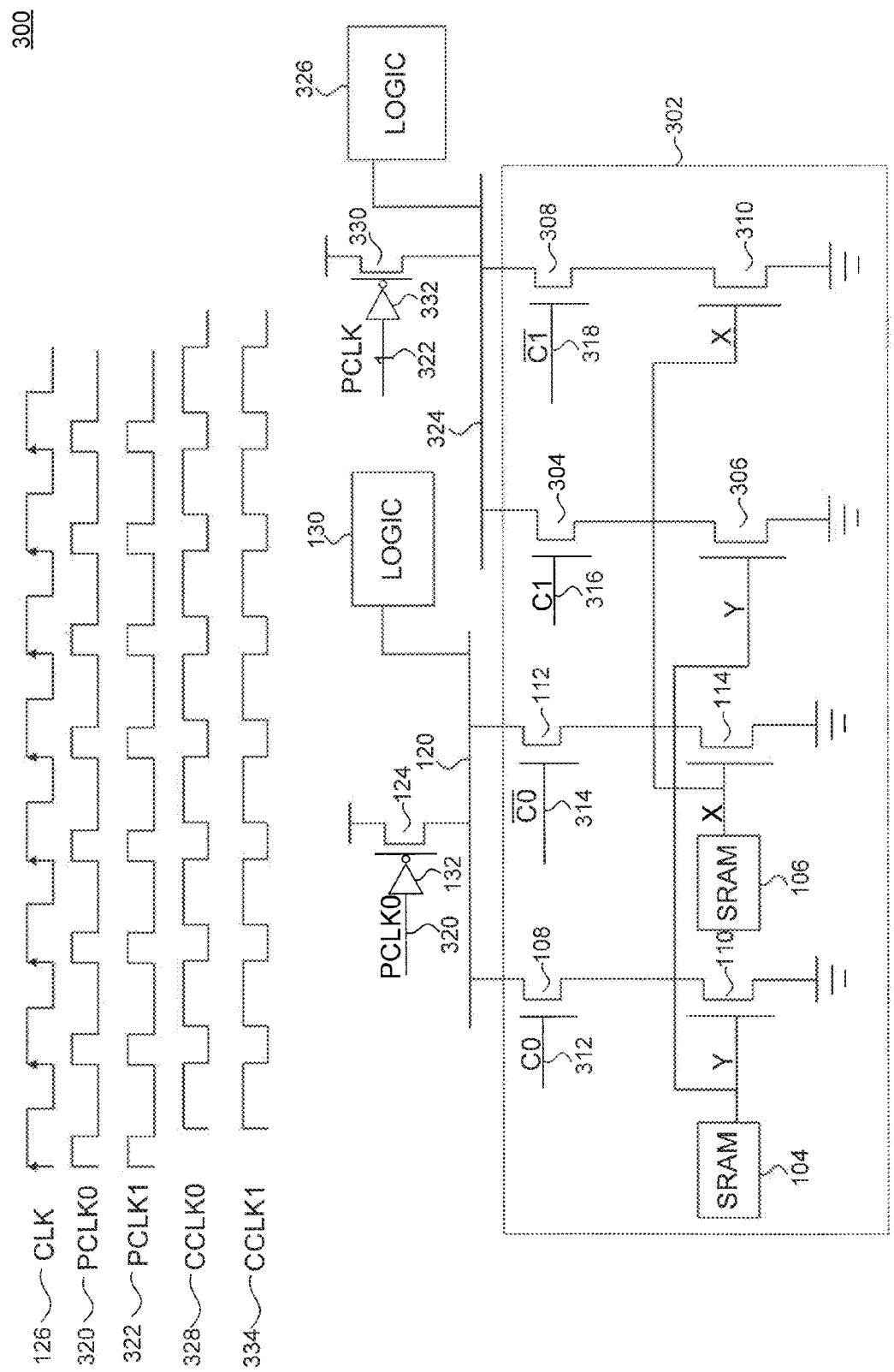
FIG. 3 illustrates an example double stack CAM.

Content addressable memory (CAM) arrays include CAM cells that are addressed based on their content rather than by physical address. Specifically, a CAM array receives a data word input (or search key), which may include one or more bits. The CAM array compares the data word input against the data stored in each row of the array. More specifically, for each row of the CAM array, the comparison includes comparing (in parallel) each bit of the data word input with a logic state stored in a corresponding CAM cell of the particular row.

A match signal is associated with each row of the CAM array to indicate whether or not the data word input matches the data stored in the row. The match signal is pre-charged to a logic high voltage value before the comparison. If at least one bit of the data word input does not match the logic state of its corresponding CAM cell, a mismatch is indicated by discharging the match signal to a logic low voltage value. Otherwise, if every bit of the data word input matches the logic state of its corresponding CAM cell, the match signal is maintained at the logic high voltage value to indicate a data match for the particular row.

FIG. 1 illustrates an example single stack content addressable memory (CAM) 100. Example CAM 100 is provided for the purpose of illustration and is not limiting of embodiments of the present disclosure. Example CAM 100 includes a CAM cell 102 and logic circuitry 130. A match line 120 couples outputs of CAM cell 102 to logic circuitry 130. CAM 100 may be timed by a free running clock, CLK 126.

As would be understood by a person of skill in the art based on the teachings herein, CAM 100 may include a plurality of CAM cells, identical to CAM cell 102 and coupled to match line 120 in the same fashion as CAM cell 102. As such, a multi-bit search key can be searched for in CAM 100. In addition, CAM 100 may include multiple rows of CAM cells, each with a respective match line 120, such that a search key can be compared against multiple data values or ranges stored in CAM 100.

As shown in FIG. 1, CAM cell 102 includes static random access memory (SRAM) bitcells 104 and 106, input transistors 108 and 112, and pull-down transistors 110 and 114. SRAM bitcells 104 and 106 may be implemented as six-transistor (6T) CMOS (complementary metal oxide semiconductor) bitcells, for example. As such, an example implementation of CAM cell 102 includes 16 transistors. Transistors 108, 110, 112, and 114 are implemented using NMOS (N-type metal oxide semiconductor) field effect transistors (FETs), but may be implemented using any other known transistor technology as would be understood by a person of skill in the art.

SRAM bitcells 104 and 106 are each configured to store a single bit value (0 or 1), which may be sensed at an output of the bitcell. The bit values stored in SRAM bitcells 104 and 106 encode a logic state. In a binary CAM cell, the logic state may be a logic high or a logic low (e.g., 0 or 1). In a ternary CAM, the logic state may be a logic high, a logic low, or a "don't care" state. When a CAM cell is configured with a "don't care" state, the CAM cell produces a match condition regardless of the data bit value applied to the CAM cell.

FIG. 2 illustrates an example logic state encoding 200 of a ternary CAM cell. Example logic state encoding 200 is provided for the purpose of illustration and is not limiting of embodiments of the present disclosure. CAM cell 102 of FIG. 1, as well as other CAM cell embodiments of the present disclosure, may be encoded using logic state encoding 200.

As shown in FIG. 2, logic state encoding 200 provides the bit values X and Y that are stored in the bitcells (e.g., with reference to FIG. 1, X is stored in bitcell 106 and Y is stored in bitcell 104) of the CAM cell as a function of a data bit 202 and a mask signal 204. Data bit 202 represents a logic value sought to be encoded in the CAM cell. Mask signal 204 determines whether the value of data bit 202 is encoded in the CAM cell or if the CAM cell instead encodes a "don't care" state regardless of data bit 202. In particular, when mask signal 204 is asserted, data bit 202 is ignored and a "don't care" state is encoded in the CAM cell by storing a "0" bit value in both bitcells. When mask signal 204 is not asserted, the value of data bit 202 controls the bit values X and Y stored in the bitcells. Specifically, X is set to "0" and Y is set to "1" to encode a 0 or a logic low in the CAM cell, and X is set to "1" and Y is set to "0" to encode a 1 or a logic high in the CAM cell.

Returning to FIG. 1, input transistors 108 and 112 are configured to receive respective input signals 116 and 118 at their respective gate terminals. The drain terminals of input transistors 108 and 112 are coupled to match line 120. The source terminals of input transistors 108 and 110 are coupled to the drain terminals of pull-down transistors 110 and 114 respectively.

Pull-down transistors 110 and 114 have their respective gate terminals coupled to the outputs of SRAM bitcells 104 and 106, respectively. The drain terminals of pull-down transistors 110 and 114 are coupled to the source terminals of input transistors 108 and 112 respectively. The source terminals of pull-down transistors 110 and 114 are coupled to ground.

In operation, the search for a data bit value (search key bit value) in CAM cell 102 includes a two-interval process over one clock cycle of CLK 126. In the first interval (pre-charge interval), match line 120 is pre-charged to a logic high voltage value. Specifically, match line 120 is pre-charged by asserting a pre-charge clock signal PCLK 122, which controls a PMOS transistor 124 via an inverter 132 to couple match line 120 to a high voltage (Vdd). During the same interval, input signals 116 and 118 are both set to a logic low voltage value such that they do not affect the pre-charged match line 120. PCLK 122 is derived from CLK 126. In practice, the rising edges of PCLK 122 may or may not be in phase with the rising edges of CLK 126.

In the second interval (compare interval), PCLK signal 122 is de-asserted. In the same interval, a compare clock signal CCLK 128 is asserted to couple the search key bit value to input signals 116 and 118. Specifically, on asserting CCLK 128, input signal 116 holds the search key bit value and input signal 118 holds the complement of the search key bit value. CCLK 128 is derived from CLK 126. In practice, the falling edges of CCLK 128 may or may not be in phase with the rising edges of CLK 126.

Figure 5:
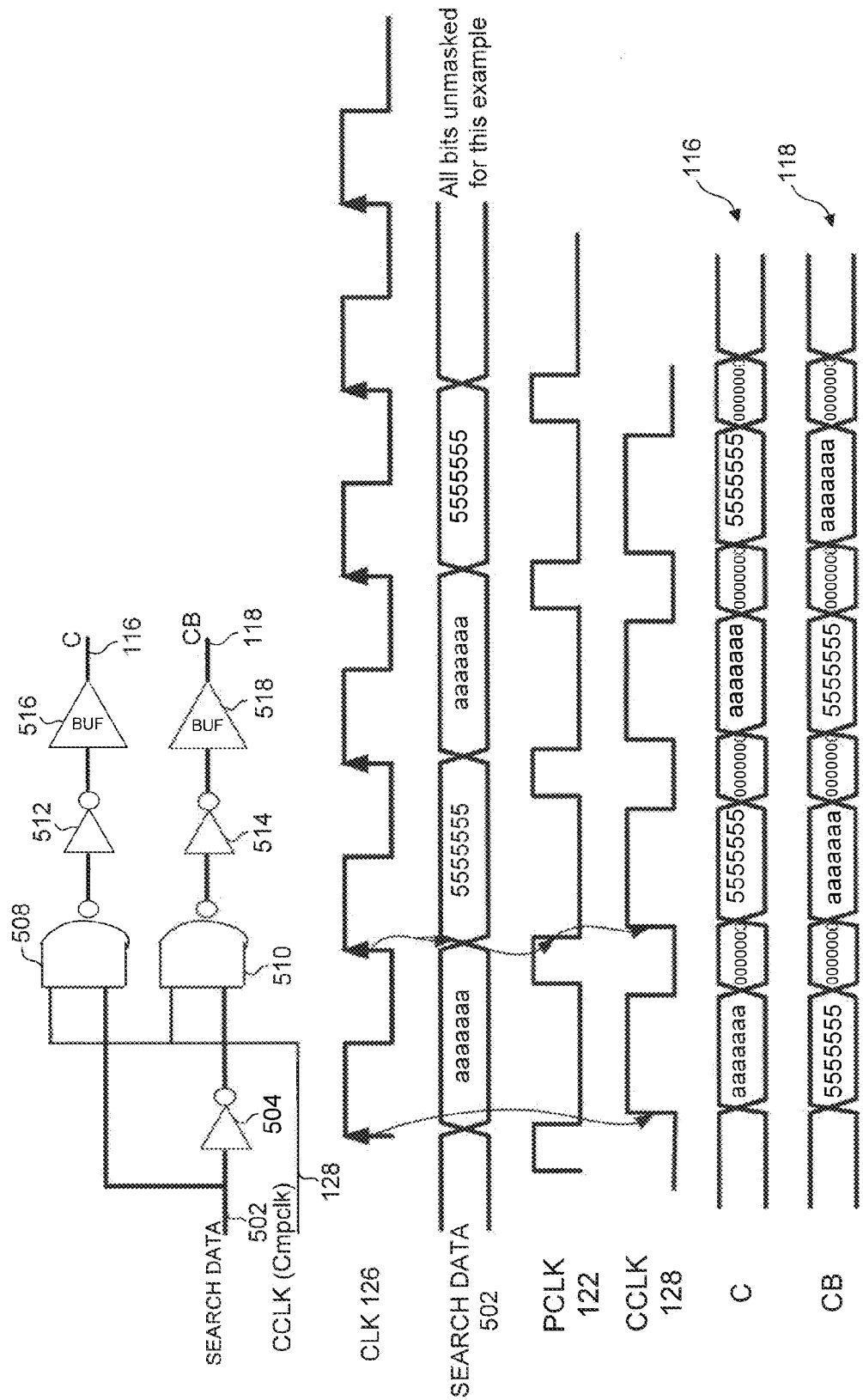
FIG. 5 illustrates an example implementation for coupling search data and/or mask data to an example CAM cell.

FIG. 5 illustrates an example implementation for coupling search data to input signals 116 and 118 of CAM cell 102. The example implementation of FIG. 5 is provided for the purpose of illustration only and is not limiting of embodiments of the present disclosure. As shown in FIG. 5, the example implementation includes NAND gates 508 and 510, inverters 504, 512, and 514, and buffers 516 and 518. NAND gate 508 receives search data 502 and CCLK 128. NAND gate 510 receives search data 502 inverted by inverter 506, and CCLK 128. The outputs of NAND gates 508 and 510 are provided respectively to inverters 512 and 514, and subsequently to buffers 516 and 518 to generate input signals 116 and 118, respectively. For illustration, FIG. 5 also shows example waveforms for CLK 126, search data 502, PCLK 122, CCLK 128, and the resulting input signals 116 and 118 for this example. All bits are assumed unmasked in the example of FIG. 5.

Returning to FIG. 1, the search key bit value carried by input signals 116 and 118 is compared to the logic state encoded in CAM cell 102 during the compare interval. If the search key bit value matches the encoded logic state, match line 120 maintains its pre-charge voltage value. Otherwise, match line 120 is discharged to ground, indicating a mismatch between the search key bit value and the encoded logic state.

In the case that CAM cell 102 is a ternary cell, a match condition occurs if (1) input signal 116 holds a logic high value (and input signal 118 holds a logic low value) and SRAM bitcells 104 and 106 store a 0 and a 1 respectively, (2) input signal 116 holds a logic low value (and input signal 118 holds a logic high value) and SRAM bitcells 104 and 106 store a 1 and a 0 respectively, or (3) SRAM bitcells 104 and 106 both store a 0 value to encode a "don't care" state. In each of these conditions, no discharge path is created in CAM cell 102 and match line 120 maintains its pre-charge voltage value. In all other conditions, a discharge path is created in CAM cell 102 (either through input transistor 108 and pull-down transistor 110, or through input transistor 112 and pull-down transistor 114), causing match line 120 to pull down to ground.

Logic circuitry 130 senses match line 120 at the end of the compare interval to determine whether a match or a mismatch condition has occurred. Typically, as mentioned above, a plurality of CAM cells of the same row are coupled to match line 120. As such, a single mismatch between a search key bit and a corresponding encoded CAM cell state is sufficient to signal a mismatch condition for the entire search key.

At the end of the clock cycle, the process described above is repeated to search for a new search key in the next clock cycle. Thus, in each clock cycle, a single search key can be searched for by CAM 100. One way to speed up the search includes making the clock cycle shorter (i.e., increasing the clock frequency). Typically, however, the clock cycle is constrained by the amount of time needed for match line 120 to discharge in the case of a single bit mismatch (single discharge path), which puts a lower limit on the compare interval. Another way that the search can be sped up is by increasing the capacity of each CAM cell such that it can handle multiple search key bits (each corresponding to a respective search key) in parallel in a single clock cycle. An example CAM that implements this approach in shown in FIG. 3 and described below.

FIG. 3 illustrates an example double stack CAM 300. Example CAM 300 is provided for the purpose of illustration and is not limiting of embodiments of the present disclosure. Example CAM 300 includes a CAM cell 302, logic circuitry 130, and logic circuitry 326. Match lines 120 and 324 couple outputs of CAM cell 302 to logic circuitry 130 and 326.

As would be understood by a person of skill in the art based on the teachings herein, CAM 300 may include a plurality of CAM cells, identical to CAM cell 302 and coupled to match lines 120 and 324 in the same fashion as CAM cell 302. As such, multiple (e.g., two) multi-bit search keys can be searched for in CAM 300. In addition, CAM 300 may include multiple rows of CAM cells, each with respective match lines 120 and 324, such that a search key can be compared against multiple data values or ranges stored in CAM 300. Further, as mentioned above, CAM 300 may include CAM cells with more than two stacks such that more than two search keys can be searched for in parallel in CAM 300 in one clock cycle.

As shown in FIG. 3, CAM cell 302 includes two stacks that share SRAM bitcells 104 and 106. The first stack, including input transistors 108 and 112 and pull-down transistors 110 and 114, is identical to the single stack of CAM cell 102 described above. For illustration, the same numerals are used for the elements of this stack as used in FIG. 1. The second stack includes input transistors 304 and 308 and pull-down transistors 306 and 310. Transistors 304, 306, 308, and 310 are implemented using NMOS FETs, but may be implemented using any other known transistor technology as would be understood by a person of skill in the art.

Match line 120 couples outputs of the first stack of CAM cell 302 to logic circuitry 130. Match line 324 couples outputs of the second stack to logic circuitry 326. Logic circuitry 326 is similar to logic circuitry 130 described above with respect to FIG. 1.

In operation, the two stacks of CAM cell 302 are operated in parallel with in-phase pre-charge and compare intervals. More specifically, as shown in FIG. 3, match lines 120 and 324 are pre-charged to logic high values at the control of pre-charge clock signals PCLK0 320 and PCLK1 322 respectively. PCLK0 320 and PCLK1 322 are in-phase with each other as shown in FIG. 3, resulting in in-phase pre-charge intervals for the two stacks. In practice, PCLK0 320 and PCLK1 322 may be the same or different waveforms. In the same manner as described above in FIG. 1, match line 120 is pre-charged by asserting PCLK0 320, which controls transistor PMOS 124 via inverter 132 to couple match line 120 to a high voltage (Vdd). Match line 324 is pre-charged by asserting PCLK1 322, which controls a PMOS transistor 330 via an inverter 332 to couple match line 324 to a high voltage (Vdd). During the same pre-charge interval, input signals 312, 314, 316, and 318 are all set to a logic low voltage value such that they do not affect the pre-charged match lines 120 and 324.

Subsequently, PCLK0 320 and PCLK1 322 are de-asserted, and two search key bit values (each corresponding to a respective search key) are applied to CAM cell 302 by asserting compare clock signal CCLK0 328 and CCLK1 334, which respectively couple a first search key bit value to input signals 312 and 314 and a second search key bit value to input signals 316 and 318. As in example CAM 100 described above, input signal 312 holds the first search key bit value and input signal 314 holds the complement of the first search key bit value. Similarly, input signal 316 holds the second search key bit value and input signal 318 holds the complement of the second search key bit value.

Because the two stacks of CAM cell 302 share the same compare clock signal, they also have in-phase compare intervals. The two search key bit values carried respectively by input signals 312, 314 and 316, 318 are compared simultaneously to the logic state encoded in CAM cell 302 during the compare interval. If the first (second) search key bit value matches the encoded logic state, match line 120 (match line 324) maintains its pre-charge voltage value. Otherwise, match line 120 (match line 324) is discharged to ground, indicating a mismatch between the first (second) search key bit value and the encoded logic state.

With the operation described above, example CAM 300 can be used to search for two search keys in a single clock cycle. Thus, effectively, example CAM 300 can provide twice the search throughput of example CAM 100 described above in FIG. 1 at the same clock frequency. More than twice the search throughput can be achieved by using more than two stacks per CAM cell. However, this higher throughput comes at the cost of additional components, with four additional transistors, one additional match line, and one additional logic circuitry for each additional stack. Additionally, CAM 300 has higher power consumption than CAM 100.

As described above, in example CAM 300, the two stacks of CAM cell 302 share SRAM bitcells 104 and 106. However, separate input and pull-down transistor pairs are needed for each stack. Specifically, the two stacks may not share a single pair of pull-down transistors because the two stacks operate in parallel with in-phase pre-charge and compare intervals. As further described below with reference to FIG. 4, a single pair of pull-down transistors may be shared by two or more stacks by time-staggering the pre-charge intervals and the compare intervals of the stacks. At least one pair of pull-down transistors can thus be eliminated, reducing the area and power consumption of the CAM.

Figure 4:
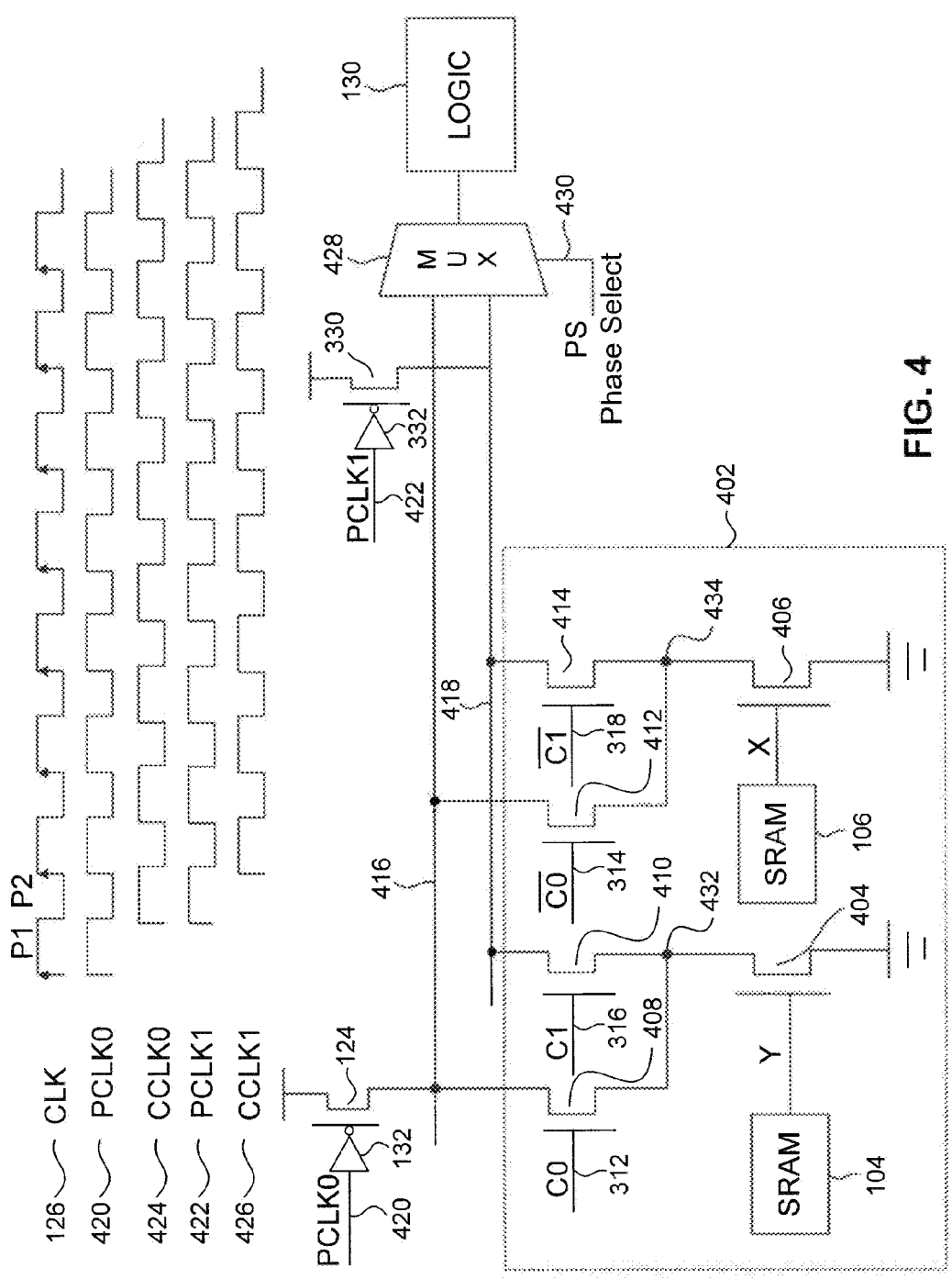
FIG. 4 illustrates an example shared stack dual phase CAM.

FIG. 4 illustrates an example shared stack dual phase CAM 400. Example CAM 400 is provided for the purpose of illustration and is not limiting of embodiments of the present disclosure. Example CAM 400 includes a CAM cell 402, a multiplexer 428, and logic circuitry 130. Example CAM 400 further includes clock circuitry (not shown in FIG. 4) configured to generate a free running clock, CLK 126. CLK 126 includes first and second non-overlapping phases (P1 and P2) in each clock cycle. Match lines 416 and 418 couple outputs of CAM cell 402 to multiplexer 428. Multiplexer 428 is controlled by a phase select signal 430 to couple either of match lines 416 and 418 to logic circuitry 130.

As would be understood by a person of skill in the art based on the teachings herein, CAM 400 may include a plurality of CAM cells, which may be identical to CAM cell 402 and coupled to match lines 416 and 418 in the same fashion as CAM cell 402. As such, multiple (e.g., two) multi-bit search keys can be searched for in CAM 400. In addition, CAM 400 may include multiple rows of CAM cells, each with respective match lines 416 and 418, such that a search key can be compared against multiple data values or ranges stored in CAM 400. Further, CAM 400 may include CAM cells with more than two stacks such that more than two search keys can be searched for in parallel in CAM 400 in one clock cycle.

As shown in FIG. 4, CAM cell 402 includes two stacks that share SRAM bitcells 104 and 106 and a single pair of pull-down transistors 404 and 406. The first stack includes input transistors 408 and 412 and pull-down transistors 404 and 406. The second stack includes input transistors 410 and 414 and pull-down transistors 404 and 406. Input transistors 408 and 410 have a common source terminal 432, and input transistors 412 and 414 have a common source terminal 434. Transistors 404, 406, 408, 410, 412, and 414 are illustrated using NMOS FETs, but may be implemented using any other known transistor technology as would be understood by a person of skill in the art. Match line 416 couples outputs of the first stack to multiplexer 428. Match line 418 couples outputs of the second stack to multiplexer 428.

As further described below, the two stacks of CAM cell 402 enable a compare circuitry which can be configured to receive a first search key bit (corresponding to a first search key) in the first phase of the clock cycle of CLK 126 (e.g., via input transistors 410 and 414) and a second search key bit (corresponding to a second search key) in the second phase of the clock cycle of CLK 126 (e.g., via input transistors 408 and 412), and which can be further configured to control match line 418 responsive to the first search key bit and match line 416 responsive to the second search key bit. As such, in a single clock, two search key bits can be searched for in CAM cell 402.

In order to be able to share pull-down transistors 404 and 406 by the two stacks, the two stacks are operated with time-staggered pre-charge intervals and compare intervals. More particularly, as shown in FIG. 4, the first stack (which includes input transistors 408 and 412) is pre-charged in accordance with a pre-charge clock PCLK0 420, which is in-phase with a compare clock CCLK1 426 of the second stack (which includes input transistors 410 and 414). The pre-charge interval of the first stack thus corresponds in time to the compare interval of the second stack. In example CAM 400, these two intervals correspond to the first phase (P1) of CLK 126. Similarly, the second stack is pre-charged in accordance with a pre-charge clock PCLK1 422, which is in-phase with a compare clock CCLK0 424 of the first stack. The pre-charge interval of the second stack thus corresponds in time to the compare interval of the first stack. In example CAM 400, these two intervals correspond to the second phase (P2) of CLK 126.

In accordance with this operation, a first search key bit carried, for example, by input signals 316 and 318 is applied via the second stack (which includes input transistors 410 and 414) and compared to the logic state encoded in CAM cell 402 during the first phase (P1) of CLK 126. Match line 418 is controlled in accordance with this comparison and is read by logic 130 by the end of this first phase. During the same phase (P1), match line 416 is pre-charged to a logic high value, and input signals 312 and 314 are both set to a logic low voltage value such that they do not affect the pre-charged match line 416. In this phase (P1), multiplexer 428 couples match line 418 to logic 130. So match line 416 does not affect the compare result of match line 418.

In the second phase (P2) of CLK 126, a second search key bit carried by input signals 312 and 314 is applied via the first stack (which includes input transistors 408 and 412) and compared to the logic state encoded in CAM cell 402. Match line 416 is controlled in accordance with this comparison and is read by logic 130 by the end of this second phase. Meanwhile, match line 418 is pre-charged to a logic high value, and input signals 316 and 318 are both set to a logic low voltage value. This two-phase process can then repeat for subsequently search key bits as described above.

With the operation described above, example CAM 400 can be used to search for two search keys in a single clock cycle. Thus, effectively, example CAM 400 can provide the same throughput as example CAM 300 described above in FIG. 3 at the same clock frequency, but with at least two less transistors per CAM cell and at least one less logic circuitry for reading match lines. Eliminating these components results in significant reduction in CAM area and power consumption.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A memory cell, comprising:
   first and second bitcells having respective outputs;
   first and second input transistors configured to receive respectively a first signal and a second signal at respective first terminals thereof, the first and second input transistors having a common second terminal;
   third and fourth input transistors configured to receive respectively a third signal and a fourth signal at respective first terminals thereof, the third and fourth input transistors having a common second terminal;
   a first shared transistor having a first terminal coupled to the output of the first bitcell and a second terminal coupled to the common second terminal of the first and second input transistors; and
   a second shared transistor having a first terminal coupled to the output of the second bitcell and a second terminal coupled to the common second terminal of the third and fourth input transistors.

2. The memory cell of claim 1, wherein the first and second bitcells are configured to store respectively first and second bit values, the first and second bit values encoding a logic state.

3. The memory cell of claim 2, wherein a third terminal of the first input transistor and a third terminal of the third input transistor are coupled to a first match line, and wherein a third terminal of the second input transistor and a third terminal of the fourth input transistor are coupled to a second match line.

4. The memory cell of claim 3, wherein the first match line is pre-charged to a logic high voltage during a first phase of a clock cycle.

5. The memory cell of claim 4, wherein the first and third input transistors are configured to receive respectively the first signal and the third signal in a second phase of the clock cycle, wherein the first phase and the second phase of the clock cycle are non-overlapping.

6. The memory cell of claim 5, wherein the first match line is configured to maintain the logic high voltage in the second phase of the clock cycle if a data value contained in the first and third signals matches the logic state encoded by the first and second bitcells, and to discharge to a logic low voltage otherwise.

7. The memory cell of claim 5, wherein the second match line is pre-charged to the logic high voltage during the second phase of the clock cycle, and wherein the second and fourth input transistors are configured to receive respectively the second signal and the fourth signal in the first phase of the clock cycle.

8. The memory cell of claim 7, wherein the second match line is configured to maintain the logic high voltage in the first phase of the clock cycle if a data value contained in the second and fourth signals matches the logic state encoded by the first and second bitcells, and to discharge to a logic low voltage otherwise.

9. The memory cell of claim 1, wherein the third signal is a complement of the first signal and the fourth signal is a complement of the second signal.

10. The memory cell of claim 1, wherein the first and second bitcells include static random access memory (SRAM) bitcells.

11. A memory cell, comprising:
    first and second bitcells configured to encode a logic state; and
    compare circuitry configured to receive a first data bit in a first phase of a clock cycle and a second data bit in a second phase of the clock cycle and to control a first match signal responsive to the first data bit and a second match signal responsive to the second data bit,
    wherein the compare circuitry comprises:
    first and second input transistors configured to receive respectively the first data bit and the second data bit at respective first terminals thereof, the first and second input transistors having a common second terminal, the first input transistor having a third terminal coupled to the first match signal and the second input transistor having a third terminal coupled to the second match signal; and
    a shared transistor having a first terminal coupled to an output of the first bitcell and a second terminal coupled to the common second terminal of the first and second input transistors.

12. The memory cell of claim 11, wherein the first phase and the second phase of the clock cycle are non-overlapping.

13. The memory cell of claim 11, wherein the first match signal includes a comparison of the first data bit and the logic state and the second match signal includes a comparison of the second data bit and the logic state.

14. The memory cell of claim 11, wherein the first match signal is pre-charged to a logic high voltage during the second phase of the clock cycle.

15. The memory cell of claim 14, wherein, in the first phase of the clock cycle, the compare circuitry is configured to discharge the first match signal to a logic low voltage if the first data bit does not match the logic state encoded by the first and second bitcells.

16. The memory cell of claim 15, wherein the second match signal is pre-charged to the logic high voltage during the first phase of the clock cycle, and wherein, in the second phase of the clock cycle, the compare circuitry is configured to discharge the second match signal to the logic low voltage if the second data bit does not match the logic state encoded by the first and second bitcells.

17. A memory, comprising:
   clock circuitry configured to generate a clock signal, wherein a clock cycle of the clock signal includes first and second phases; and
   a memory cell comprising:
      first and second bitcells configured to encode a logic state; and
      compare circuitry configured to receive a first data bit in the first phase of the clock cycle and a second data bit in the second phase of the clock cycle and to control a first match signal responsive to the first data bit and a second match signal responsive to the second data bit, wherein the compare circuitry comprises:
         first and second input transistors configured to receive respectively the first data bit and the second data bit at respective first terminals thereof, the first and second input transistors having a common second terminal, the first input transistor having a third terminal coupled to the first match signal and the second input transistor having a third terminal coupled to the second match signal; and
         a shared transistor having a first terminal coupled to an output of the first bitcell and a second terminal coupled to the common second terminal of the first and second input transistors.

18. The memory of claim 17, further comprising:
logic circuitry configured to determine whether the first data bit matches the logic state based on the first match signal and whether the second data bit matches the logic state based on the second match signal.

19. The memory of claim 18, further comprising:
a multiplexer configured to couple the logic circuitry to the first match signal during the first phase of the clock cycle and to the second match signal during the second phase of the clock cycle.

20. The memory of claim 17, wherein the first phase and the second phase of the clock cycle are non-overlapping.

* * * * *